(12) United States Patent  
Zhang et al.

(10) Patent No.: US 9,379,146 B2  
(45) Date of Patent: Jun. 28, 2016

(54) METHOD FOR MANUFACTURING ARRAY SUBSTRATE AND METHOD FOR FORMING THROUGH HOLE

(71) Applicant: BOE TECHNOLOGY GROUP CO., LTD., Beijing (CN)

(72) Inventors: Li Zhang, Beijing (CN); Liangchen Yan, Beijing (CN); Fengjuan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/429,247

(22) PCT Filed: Jul. 18, 2014

(86) PCT No.: PCT/CN2014/082559  
§ 371 (c)(1),  
(2) Date: Mar. 18, 2015

(87) PCT Pub. No.: WO2015/067069  
PCT Pub. Date: May 14, 2015

(65) Prior Publication Data  
US 2016/0013220 A1   Jan. 14, 2016

(30) Foreign Application Priority Data

Nov. 5, 2013   (CN) .......................... 2013 1 0542331

(51) Int. Cl.  
*H01L 21/768*    (2006.01)  
*H01L 21/283*    (2006.01)  
*H01L 27/12*     (2006.01)  
*H01L 29/417*    (2006.01)  
(Continued)

(52) U.S. Cl.  
CPC .......... *H01L 27/1262* (2013.01); *H01L 21/283* (2013.01); *H01L 21/76802* (2013.01); *H01L 21/76885* (2013.01); *H01L 27/1288* (2013.01); *H01L 29/41733* (2013.01); *H01L 29/42384* (2013.01); *H01L 29/66742* (2013.01)

(58) Field of Classification Search  
None  
See application file for complete search history.

(56) References Cited

U.S. PATENT DOCUMENTS 7,807,486 B2    10/2010   Kwack  
2004/0018712 A1 *  1/2004  Plas ................. H01L 21/76898  
                                                                438/612

(Continued)

FOREIGN PATENT DOCUMENTS

CN    101211118 A    7/2008  
CN    101414085 A    4/2009

(Continued)

OTHER PUBLICATIONS

Oct. 24, 2014—(WO) International Search Report—App PCT/CN2014/082559.

*Primary Examiner* — Asok K Sarkar  
(74) *Attorney, Agent, or Firm* — Banner & Witcoff, Ltd.

(57) ABSTRACT

A method for manufacturing an array substrate and a method for forming a through hole are provided. The method for manufacturing the array substrate comprise: coating photoresist in an insulating layer through-hole region on a substrate; depositing an insulating layer on the substrate provided with the photoresist in the insulating layer through-hole region; and stripping off the photoresist in the insulating layer through-hole region to form an insulating layer through hole. The manufacturing method simplifies the process of forming the insulating layer through hole.

10 Claims, 8 Drawing Sheets

(51) Int. Cl.
*H01L 29/423* (2006.01)
*H01L 29/66* (2006.01)

(56) References Cited

U.S. PATENT DOCUMENTS

2005/0059178 A1 3/2005 Erchak et al.
2009/0101908 A1 4/2009 Kwack
2010/0117071 A1 5/2010 Inoue et al.
2010/0328567 A1 12/2010 Kwack

FOREIGN PATENT DOCUMENTS

| | | |
|---|---|---|
| CN | 101847608 A | 9/2010 |
| CN | 102709327 A | 10/2012 |
| CN | 103560088 A | 2/2014 |

* cited by examiner

METHOD FOR MANUFACTURING ARRAY SUBSTRATE AND METHOD FOR FORMING THROUGH HOLE

The application is a U.S. National Phase Entry of International Application No. PCT/CN2014/082559 filed on Jul. 18, 2014, designating the United States of America and claiming priority to Chinese Patent Application No. 201310542331.3 filed on Nov. 5, 2013. The present application claims priority to and the benefit of the above-identified applications and the above-identified applications are incorporated by reference herein in their entirety.

TECHNICAL FIELD

At least one embodiment of the present invention relates to a method for manufacturing an array substrate and a method for forming a through hole.

BACKGROUND

An array substrate comprises different layer structures. In the array substrate, typically some through holes are formed in insulating layers so as to connect conductive portions separated by the insulating layers.

Currently, all the through holes in each insulating layer must be formed by independent patterning processes. Moreover, the array substrate generally comprises a plurality of insulating layers.

SUMMARY

At least one embodiment of the present invention provides a method for manufacturing an array substrate and a method for forming a through hole so as to simplify the process of forming an insulating layer through hole.

At least one embodiment of the present invention provides a method for forming a through hole, which comprises: coating photoresist (PR) in an insulating layer through-hole region on a substrate; depositing an insulating layer on the substrate provided with the photoresist in the insulating layer through-hole region; and stripping off the photoresist in the insulating layer through-hole region to form an insulating layer through hole.

At least one embodiment of the present invention provides a method for manufacturing an array substrate, which comprises: coating photoresist in an insulating layer through-hole region on a substrate; depositing an insulating layer on the substrate provided with the photoresist in the insulating layer through-hole region; and stripping off the photoresist in the insulating layer through-hole region to form an insulating layer through hole.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The inventors of the application found that: because the process of forming a through hole in an insulating layer by an independent patterning process is relatively complex, the embodiments of the present invention provide the method for manufacturing the array substrate and the method for forming the through hole so as to simplify the method for forming the insulating layer through hole.

At least one embodiment of the present invention provides a method for forming a through hole, which comprises: coating photoresist in an insulating layer through-hole region on a substrate; depositing an insulating layer on the substrate provided with the photoresist in the insulating layer through-hole region; and stripping off the photoresist in the insulating layer through-hole region to form an insulating layer through hole. In the method for forming the through hole provided by the embodiment, after the process of depositing the insulating layer, the photoresist in the through-hole region is stripped off. At this point, the insulating layer in the through-hole region is stripped off at the same time. Thus, an independent patterning process is not required to form the through hole, and hence the process of forming the insulating layer through hole can be simplified and the influence by more exposure and dry etching processing steps on the uniformity and stability of a device can be avoided.

Figure 6:
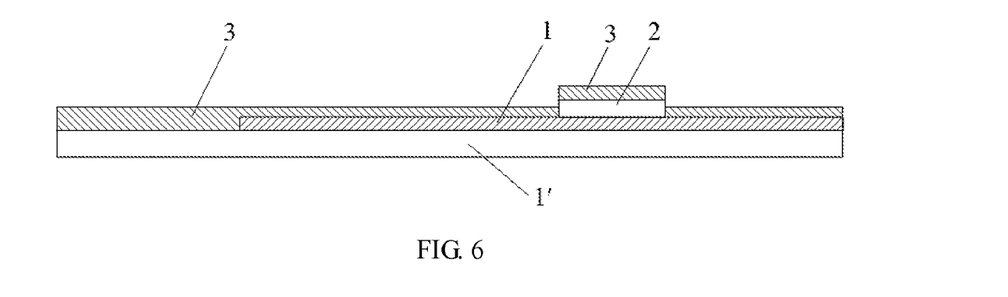
Figure 7:
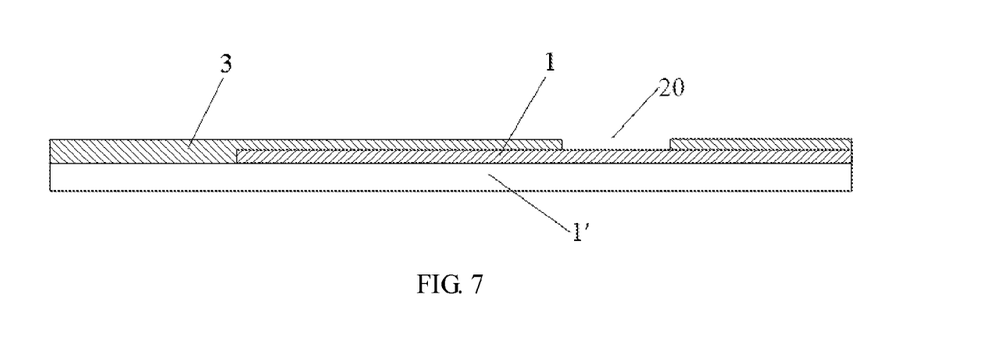

At least one embodiment of the present invention provides a method for manufacturing an array substrate. As illustrated in FIGS. 6 and 7, the method comprises: coating photoresist 2 in an insulating layer through-hole region on a substrate 1'; depositing an insulating layer 3 on the substrate 1' provided with the photoresist 2 in the insulating layer through-hole region; and stripping off the photoresist 2 in the insulating layer through-hole region to form an insulating layer through hole 20. In the method for manufacturing the array substrate provided by the embodiment, after the process of depositing the insulating layer, the photoresist in the through-hole region is stripped off. At this point, the insulating layer in the through-hole region is stripped off at the same time. Thus, an independent patterning process is not required to form the through hole, and hence the process of forming the insulating layer through hole can be simplified and the influence from more exposure and dry etching processing steps on the uniformity and stability of a device can be avoided.

First Embodiment

Figure 1:
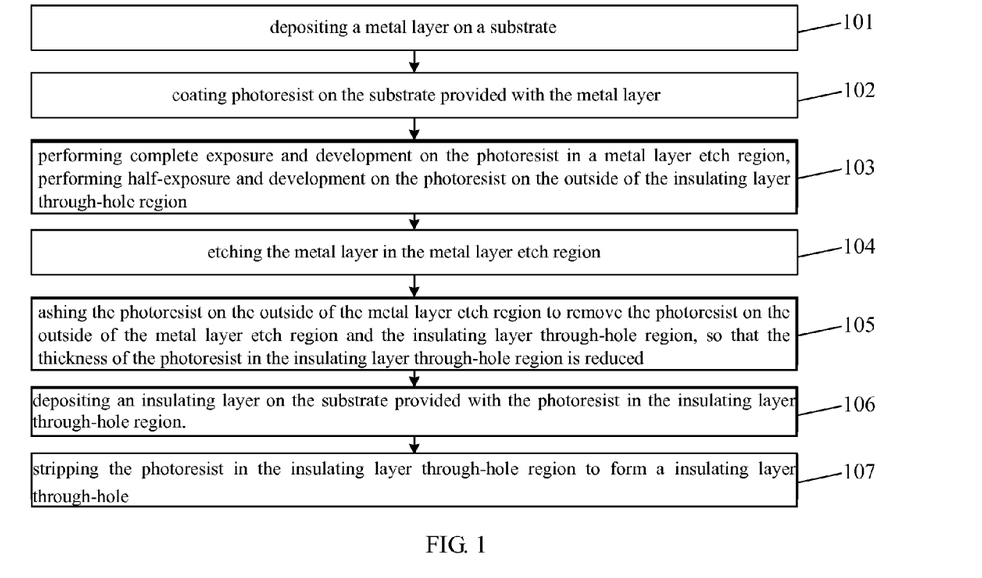
FIG. 1 is a flowchart of a method for manufacturing an array substrate, provided by a first embodiment of the present invention.
Figure 2:
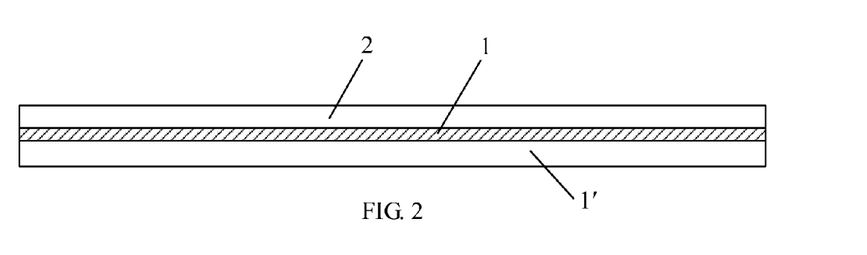
FIGS. 2 to 7 are sectional views of an array substrate provided by the first embodiment of the present invention.

As illustrated in FIG. 1, the embodiment provides a method for manufacturing an array substrate, which comprises the following steps:

Step 101: as illustrated in FIG. 2, depositing a metal layer 1 on a substrate 1'.

Step 102: coating photoresist 2 on the substrate 1' provided with the metal layer 1.

Figure 3:
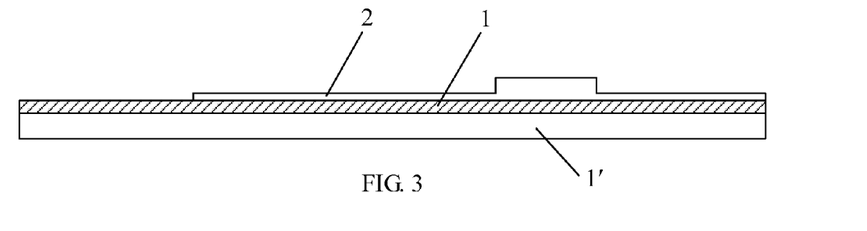

Step 103: as illustrated in FIG. 3, performing complete exposure and development on the photoresist 2 in a metal layer etch region to remove the photoresist 2 in the metal layer etch region; taking the insulating layer through-hole region as a non-exposed region, namely the photoresist 2 in the insulating layer through-hole region is completely retained; and performing half-exposure and development on the photoresist 2 outside of the insulating layer through-hole region to reduce the thickness of the photoresist 2 outside of the insulating layer through-hole region.

Figure 4:
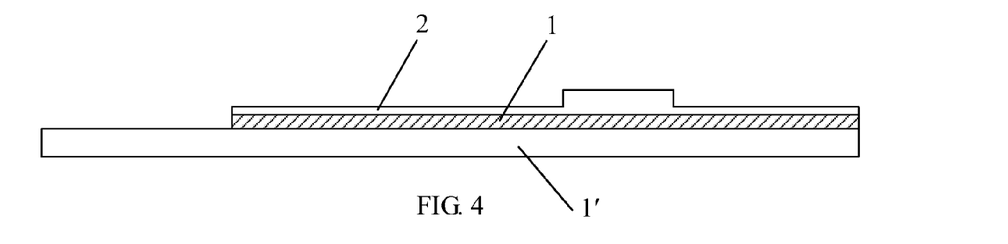

Step 104: as illustrated in FIG. 4, etching the metal layer 1 in the metal layer etch region by taking the photoresist 2 as a mask to obtain a metal layer pattern.

Figure 5:
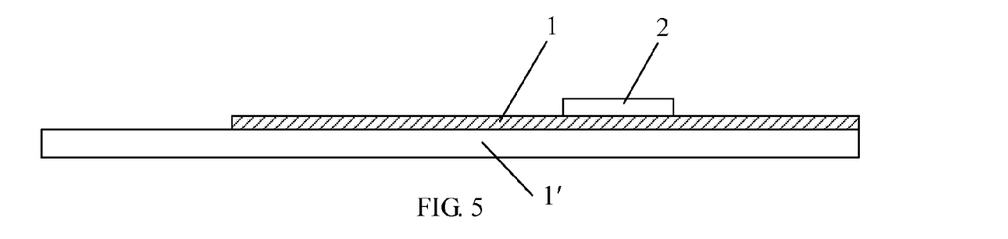

Step 105: as illustrated in FIG. 5, ashing the photoresist 2 outside of the metal layer etch region to remove the photoresist 2 outside of the metal layer etch region and the insulating layer through-hole region, so that the thickness of the photoresist 2 in the insulating layer through-hole region is reduced. As the thickness of the photoresist 2 in the insulating layer through-hole region before ashing is maximum, the photoresist 2 outside of the insulating layer through-hole region can be conveniently removed by ashing and only the photoresist 2 in the insulating layer through-hole region is retained.

Step 106: as illustrated in FIG. 6, depositing an insulating layer 3 on the substrate 1' provided with the photoresist 2 in the insulating layer through-hole region.

Step 107: as illustrated in FIG. 7, stripping off the photoresist 2 in the insulating layer through-hole region. As the insulating layer 3 in the insulating layer through-hole region covers the photoresist 2 previously, the insulating layer 3 in the insulating layer through-hole region is naturally removed in the process of stripping off the photoresist 2, and hence the insulating layer through hole 20 is naturally formed.

It should be noted that: in different examples, the half-exposure may be half-tone exposure or gray-tone exposure and is configured to control the residual thickness of photoresist after development by limiting the light transmittance in exposure. In addition, in one example, the ashing may be $O_2$ plasma ashing.

In the method for manufacturing the array substrate provided by the embodiment, the photoresist taken as the metal layer mask is retained in the through-hole region by adoption of the half-exposure process; and after the process of depositing the insulating layer, the photoresist in the through-hole region is stripped off. At this point, the insulating layer in the through-hole region is stripped off at the same time. Thus, an independent patterning process is not required to form the through hole, and hence the process of forming the insulating layer through hole can be simplified and the influence from more exposure and dry etching processing steps on the uniformity and stability of a device can be avoided.

Second Embodiment

On the basis of the embodiment 1, detailed description will be given in the embodiment to the process of forming a passivation layer through hole by taking a method for manufacturing an array substrate of a liquid crystal display (LCD) as an example.

The metal layer is a source/drain metal layer in the embodiment; the insulating layer is a passivation layer in the embodiment; and the insulating layer through-hole region is a passivation layer through-hole region in the embodiment.

Figure 8:
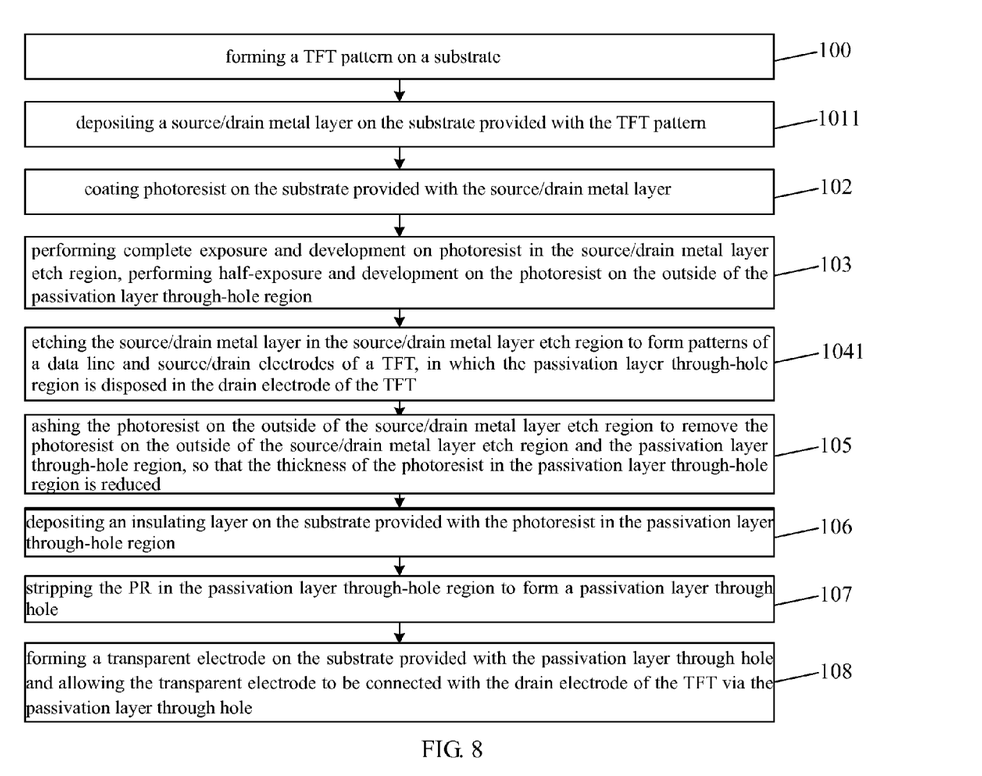
FIG. 8 is a flowchart of a method for manufacturing an array substrate, provided by a second embodiment of the present invention.

In one example, as illustrated in FIG. 8, before the step 101, the method may further comprise step 100: forming a TFT pattern on a substrate.

The step 101 is, for instance, step 1011: depositing a source/drain metal layer on the substrate provided with the TFT pattern.

Step 102: depositing a source/drain metal layer on the substrate provided with the TFT pattern.

Step 103: performing complete exposure and development on photoresist in a source/drain metal layer etch region to remove the photoresist in the source/drain metal layer etch region; taking a passivation layer through-hole region as a non-exposed region; and performing half-exposure and development on the photoresist outside of the passivation layer through-hole region to reduce the thickness of the photoresist outside of the passivation layer through-hole region.

Step 104, namely the process of etching the metal layer in the metal layer etch region, is, for instance, step 1041: etching a source/drain metal layer in the source/drain metal layer etch region to form patterns of a data line and source/drain electrodes of a TFT, in which the passivation layer through-hole region is at the drain electrode of the TFT.

Step 105: ashing the photoresist outside of the source/drain metal layer etch region to remove the photoresist outside of the source/drain metal layer etch region and the passivation layer through-hole region, so that the thickness of the photoresist in the passivation layer through-hole region is reduced.

Step 106: depositing an insulating layer on the substrate provided with the photoresist in the passivation layer through-hole region.

Step 107: stripping off the photoresist in the passivation layer through-hole region to form a passivation layer through hole.

After the step 107, the method may further comprise step 108: forming a transparent electrode on the substrate provided with the passivation layer through hole and allowing the transparent electrode to be connected with the drain electrode of the TFT via the passivation layer through hole.

It should be noted that: the method for manufacturing the array substrate provided by the embodiment may also be used for forming the passivation layer through hole in other types of displays, for instance, used for forming the passivation layer through hole in an organic light-emitting diode (OLED) display. The only difference is that formed patterns or structures are different. But both the source/drain metal layer to be subjected to pattern etching and the passivation layer adjacent to the source/drain metal layer should be included.

In the method for manufacturing the array substrate provided by the embodiment, the photoresist taken as the metal layer mask is retained in the through-hole region by adoption of the half-exposure process; and after the process of depositing the insulating layer, the photoresist in the through-hole region is stripped off. At this point, the insulating layer in the through-hole region is stripped off at the same time. Thus, an independent patterning process is not required to form the through hole, and hence the process of forming the insulating layer through hole can be simplified and the influence from more exposure and dry etching processing steps on the uniformity and stability of a device can be avoided.

Third Embodiment

On the basis of the embodiment 1, detailed description will be given in the embodiment to the process of forming a gate insulating layer through hole and a passivation layer through hole by taking a method for manufacturing an array substrate in an OLED display as an example.

The metal layer in the embodiment 1 is a gate metal layer in the embodiment, and the insulating layer is a gate insulating layer.

Figure 9:
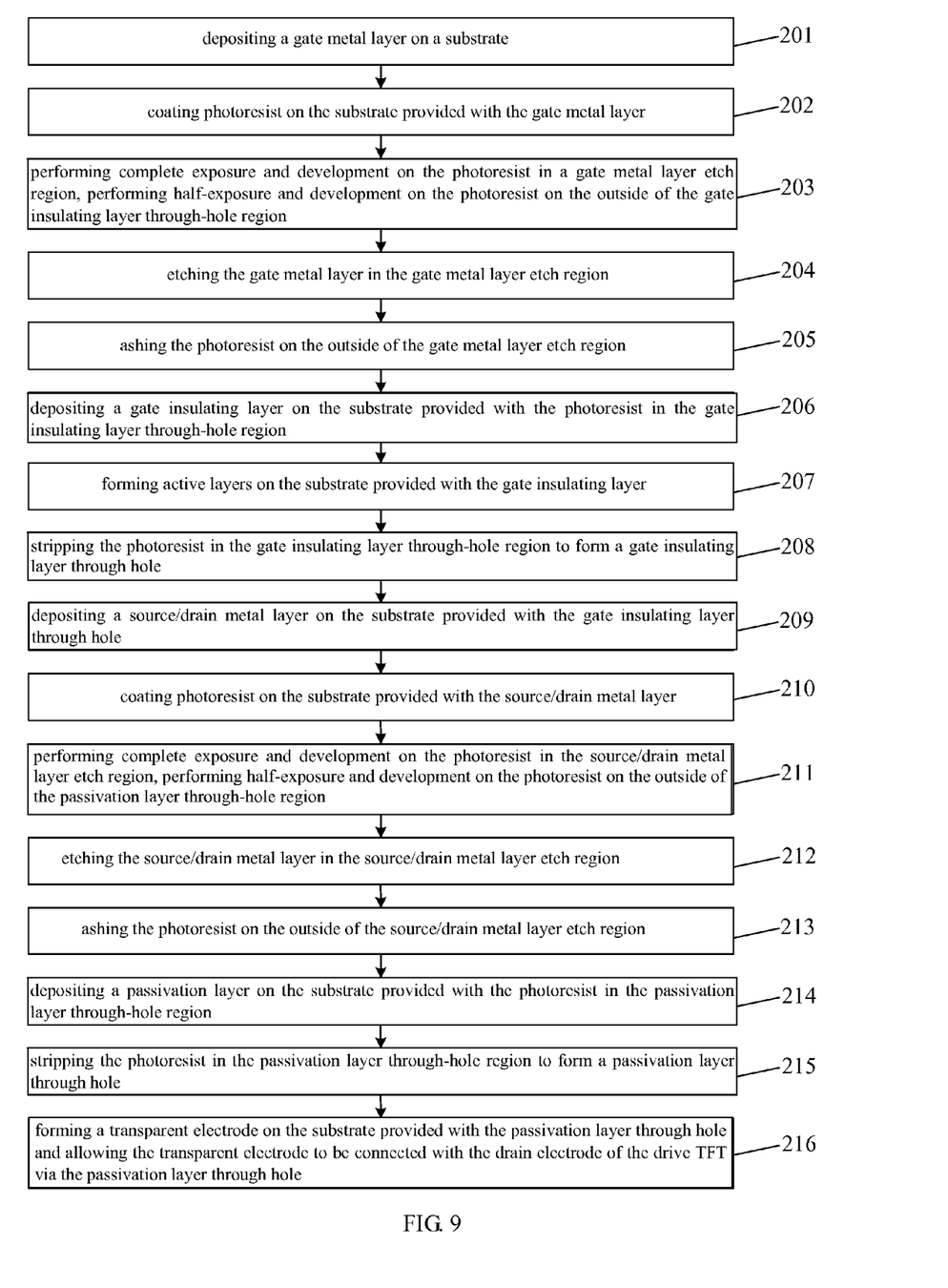
FIG. 9 is a flowchart of a method for manufacturing an array substrate, provided by a third embodiment of the present invention.
Figure 10:
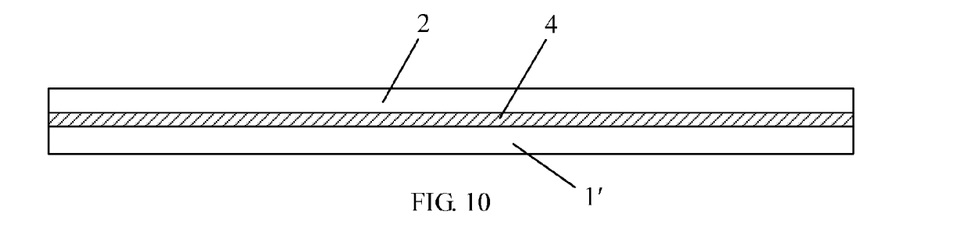
FIGS. 10, 11, 13, 14, 15, 16, 18, 19, 20, 22, 23 and 24 are sectional views of the array substrate provided by the third embodiment of the present invention.

As illustrated in FIG. 9, the method for manufacturing the array substrate provided by the embodiment comprises the following steps:

Step 201: as illustrated in FIG. 10, depositing a gate metal layer 4 on a substrate 1'.

Step 202: coating photoresist 2 on the substrate 1' provided with the gate metal layer 4.

Figure 11:
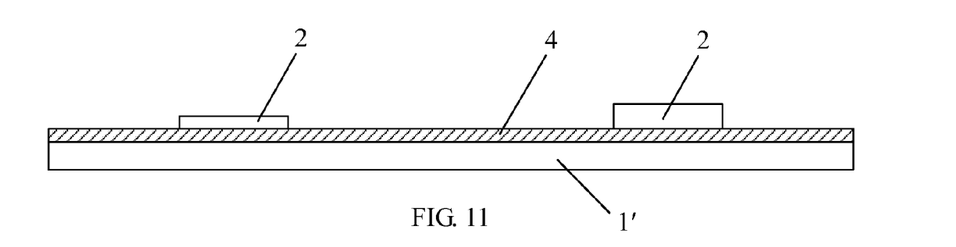
Figure 12:
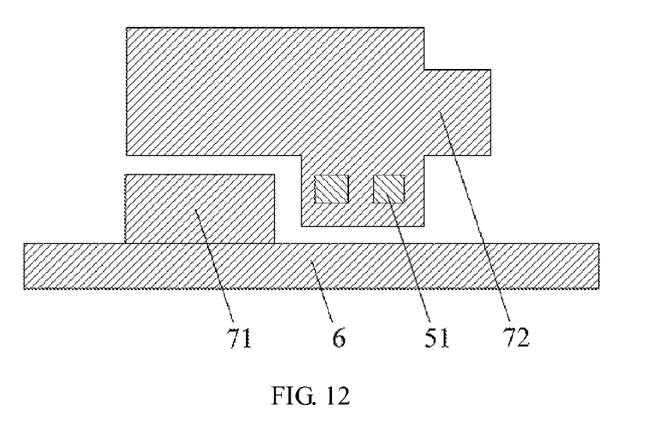
FIGS. 12, 17, 21 and 25 are plan views of the array substrate provided by the third embodiment of the present invention.

Step 203: as illustrated in FIGS. 11 and 12, performing complete exposure and development on the photoresist 2 in a gate metal layer etch region to remove the photoresist 2 in the gate metal layer etch region; taking gate insulating layer through-hole regions 51 as non-exposed regions; and performing half-exposure and development on the photoresist 2 outside of the gate insulating layer through-hole region 51 to reduce the thickness of the photoresist 2 outside of the gate insulating layer through-hole region 51.

Figure 13:
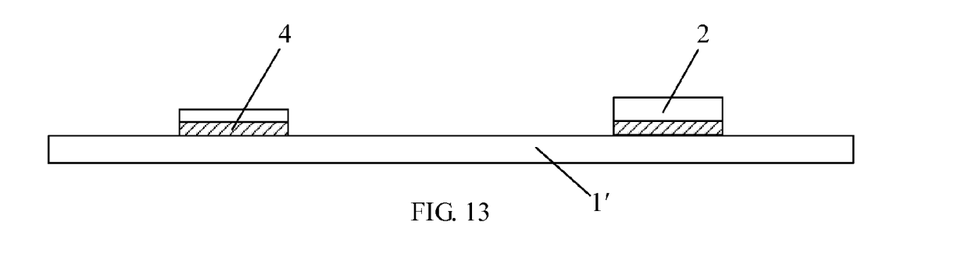

Step 204: as illustrated in FIGS. 13 and 12, etching the gate metal layer 4 in the gate metal layer etch region to form patterns of a gate line 6, a gate electrode 71 of a switching TFT and a gate electrode 72 of a drive TFT, in which the gate insulating layer through-hole region 51 is disposed in the gate electrode 72 of the drive TFT.

Figure 14:
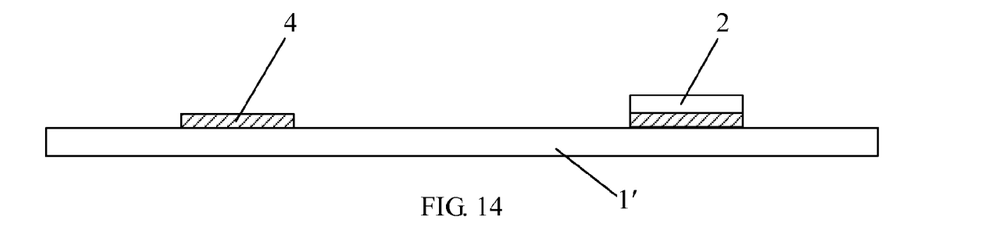

Step 205: as illustrated in FIGS. 14 and 12, ashing the photoresist 2 outside of the gate metal layer etch region to remove the photoresist 2 outside of the gate insulating layer through-hole region 51, namely only retaining the photoresist 2 in the gate insulating layer through-hole region 51 and reducing the thickness of the photoresist 2 in the gate insulating layer through-hole region 51.

Figure 15:
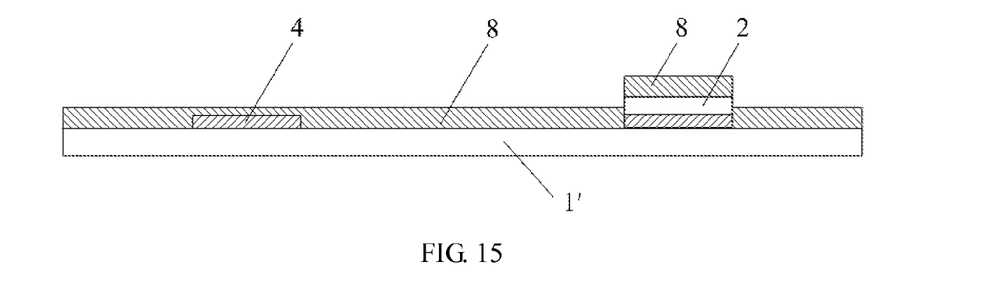

Step 206: as illustrated in FIG. 15, depositing a gate insulating layer 8 on the substrate 1' provided with the photoresist 2 in the gate insulating layer through-hole region.

Figure 16:
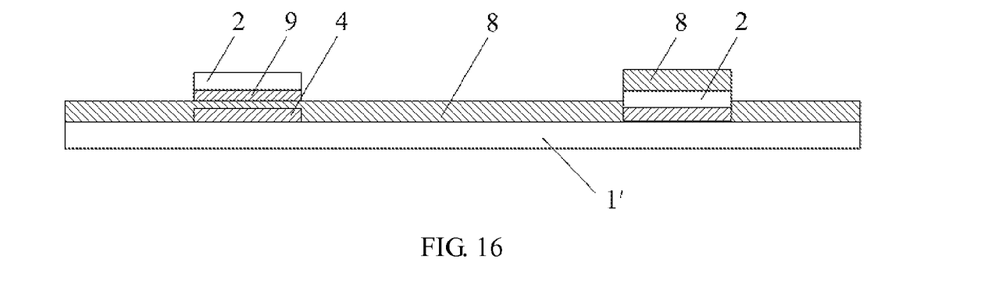
Figure 17:
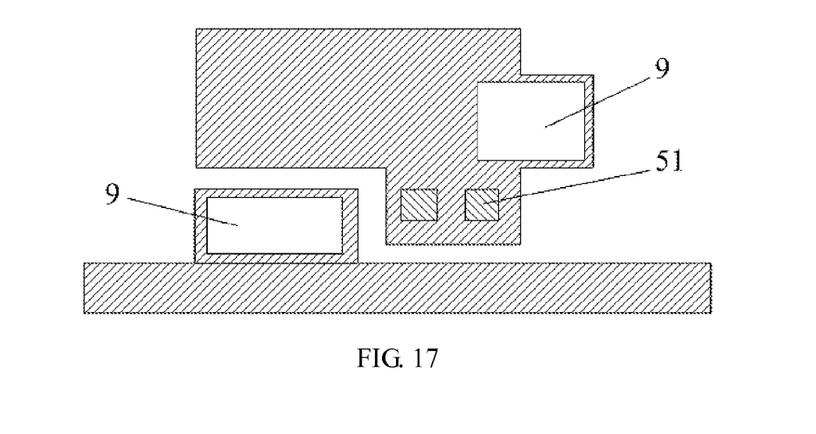

Step 207: as illustrated in FIGS. 16 and 17, forming an active layer 9 on the substrate 1' provided with the gate insulating layer 8. In one example, the process of forming the active layers 9 may include: depositing an active material layer and coating the photoresist 2 in sequence; performing exposure and development on the photoresist 2; etching the active material layer; finally forming the active layers 9 disposed on the gate electrode of the switching TFT and the gate electrode of the drive TFT; and retaining the photoresist 2 on the active layer 9.

Figure 18:
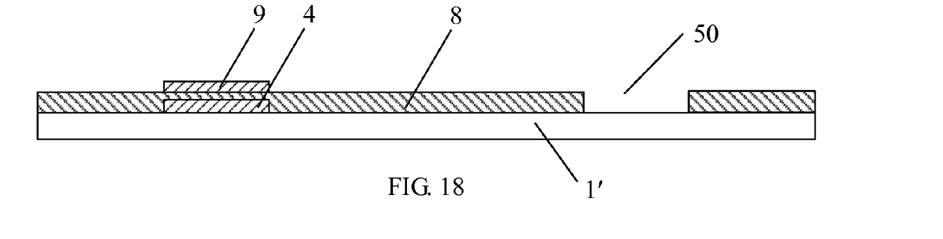

Step 208: as illustrated in FIGS. 18 and 17, stripping off the photoresist 2 in the gate insulating layer through-hole region 51 to form a gate insulating layer through hole 50, and stripping off the photoresist 2 on the active layer 9 at the same time.

Thus, the gate insulating layer through hole is formed. The process of forming the passivation layer through hole comprises the following steps.

Figure 19:
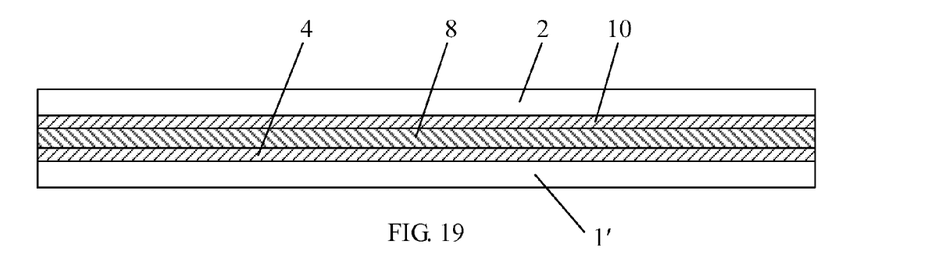

Step 209: as illustrated in FIG. 19, depositing a source/drain metal layer 10 on the substrate 1' provided with the gate insulating layer through hole 50.

Step 210: coating photoresist 2 on the substrate 1' provided with the source/drain metal layer 10.

Figure 20:
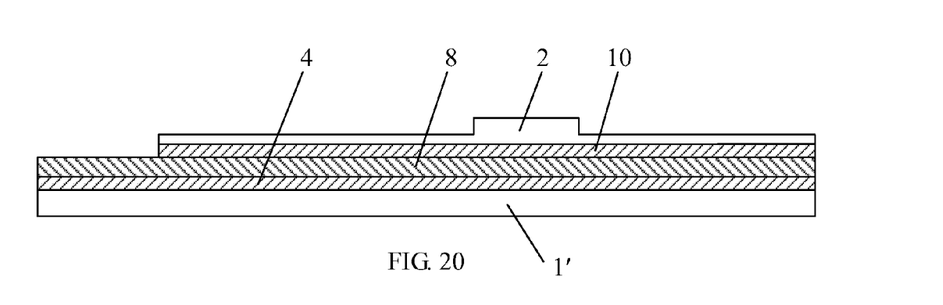
Figure 21:
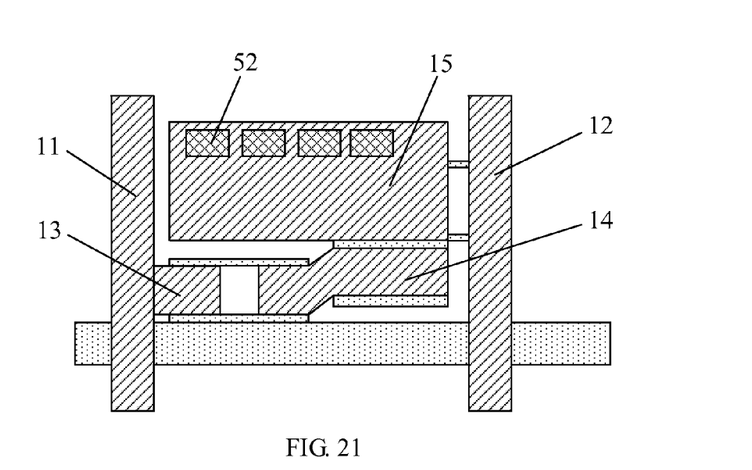

Step 211: as illustrated in FIGS. 20 and 21, performing complete exposure and development on the photoresist 2 in a source/drain metal layer etch region to remove the photoresist 2 in the source/drain metal layer etch region; taking passivation layer through-hole regions 52 as non-exposed regions; and performing half-exposure and development on the photoresist 2 outside of the passivation layer through-hole region 52 to reduce the thickness of the photoresist 2 outside of the passivation layer through-hole region 52.

Step 212: etching the source/drain metal layer 10 in the source/drain metal layer etch region to form patterns of a data line 11, a fixed voltage line 12 (namely a source electrode of the drive TFT), a source electrode 13 of the switching TFT, a drain electrode 14 of the switching TFT and a drain electrode 15 of the drive TFT, in which the passivation layer through-hole region 52 is disposed in the drain electrode 15 of the drive TFT.

Figure 22:
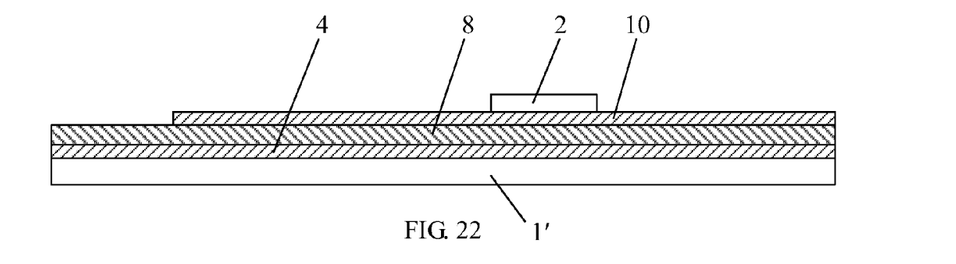

Step 213: as illustrated in FIG. 22, ashing the photoresist 2 outside of the source/drain metal layer etch region to remove the photoresist 2 outside of the passivation layer through-hole region 52, so that the thickness of the photoresist 2 in the passivation layer through-hole region 52 is reduced.

Figure 23:
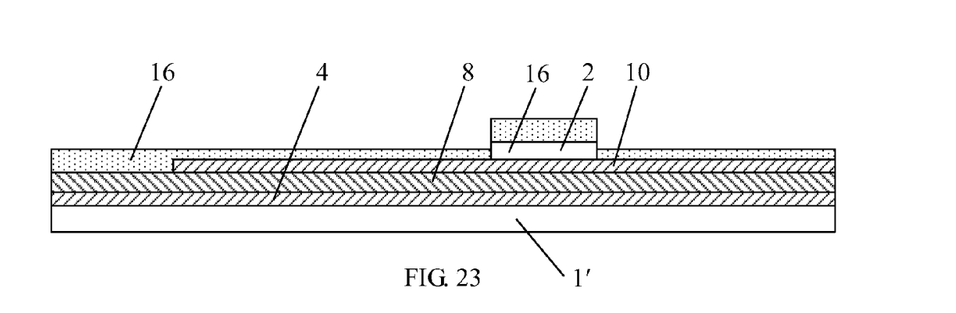

Step 214: as illustrated in FIG. 23, depositing a passivation layer 16 on the substrate 1' provided with the photoresist 2 in the passivation layer through-hole region.

Figure 24:
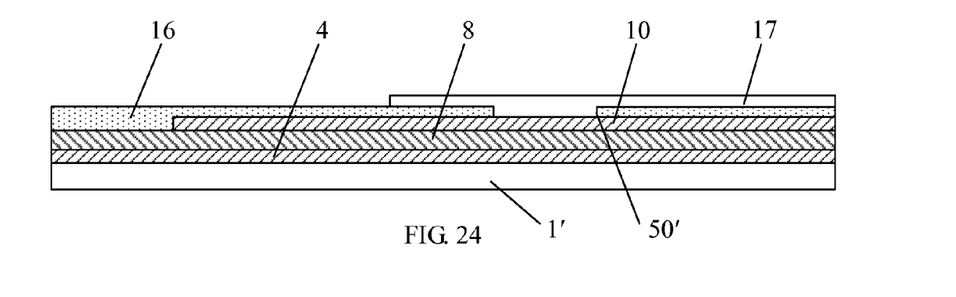

Step 215: as illustrated in FIG. 24, stripping off the photoresist 2 in the passivation layer through-hole region 52 to form a passivation layer through hole 50'.

Figure 25:
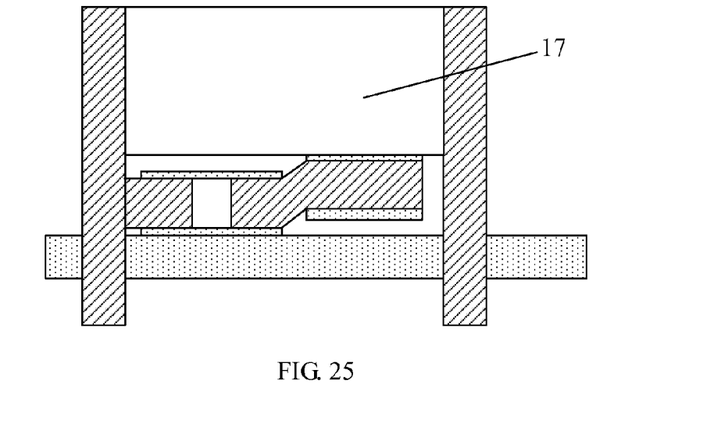

Step 216: as illustrated in FIGS. 24 and 25, forming a transparent electrode 17 on the substrate 1' provided with the passivation layer through hole 50' and allowing the transparent electrode 17 to be connected with the drain electrode 15 of the drive TFT via the passivation layer through hole 50'.

It should be noted that: detailed description is given in the embodiment to the process of manufacturing the array substrate only by taking a typical OLED array substrate comprising a switching TFT and a drive TFT and adopting a bottom-gate structure as an example.

In the method for manufacturing the array substrate provided by the embodiment, the photoresist taken as the metal layer mask is retained in the through-hole region by adoption of the half-exposure process; and after the process of depositing the insulating layer, the photoresist in the through-hole region is stripped off. At this point, the insulating layer in the through-hole region is stripped off at the same time. Thus, an independent patterning process is not required to form the through hole, and hence the process of forming the insulating layer through hole can be simplified and the influence from more exposure and dry etching processing steps on the uniformity and stability of a device can be avoided.

In the second embodiment and the third embodiment, the method for manufacturing the array substrate, provided by the embodiment of the present invention, is described only by taking the process of forming the passivation layer through hole and the gate insulating layer through hole as an example. The method is also applicable to the process of forming other types of non-metal layer through holes on the array substrate.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201310542331.3 submitted on Nov. 5, 2013. The disclosure content of the Chinese patent application is entirely incorporated by reference herein as part of the application.

The invention claimed is:

1. A method for forming a through hole, comprising:
    coating photoresist on a substrate, and forming the photoresist into a photoresist portion in an insulating layer through-hole region;
    depositing an insulating layer on the substrate provided with the photoresist portion in the insulating layer through-hole region; and
    stripping off the photoresist portion in the insulating layer through-hole region to form an insulating layer through hole.

2. A method for manufacturing an array substrate, comprising:
    coating photoresist on a substrate, and forming the photoresist into a photoresist portion in an insulating layer through-hole region;
    depositing an insulating layer on the substrate provided with the photoresist portion in the insulating layer through-hole region; and
    stripping off the photoresist portion in the insulating layer through-hole region to form an insulating layer through hole.

3. The method for manufacturing the array substrate according to claim 2, comprising:
    depositing a metal layer on the substrate;
    coating photoresist on the substrate provided with the metal layer;
    performing complete exposure and development on the photoresist in a metal layer etch region to remove the photoresist in the metal layer etch region, taking the insulating layer through-hole region as a non-exposed region, and performing half-exposure and development on the photoresist outside of the insulating layer through-hole region to reduce the thickness of the photoresist outside of the insulating layer through-hole region;
    etching the metal layer in the metal layer etch region;
    ashing the photoresist outside of the metal layer etch region to remove the photoresist outside of the metal layer etch region and the insulating layer through-hole region, so that the thickness of the photoresist in the insulating layer through-hole region is reduced;
    depositing an insulating layer on the substrate provided with the photoresist in the insulating layer through-hole region; and
    stripping off the photoresist in the insulating layer through-hole region to form an insulating layer through hole.

4. The method for manufacturing the array substrate according to claim 3, wherein
    the metal layer comprises a source/drain metal layer; the insulating layer comprises a passivation layer; the insulating layer through-hole region comprises a passivation layer through-hole region; the insulating layer through hole comprises a passivation layer through hole;
    the process of etching the metal layer in the metal layer etch region comprises: etching the source/drain metal layer in a source/drain metal layer etch region to form patterns of a data line and source/drain electrodes of a TFT, in which the passivation layer through-hole region is at the drain electrode of the TFT; and
    after the process of forming the passivation layer through hole, the method further comprises: forming a transparent electrode on the substrate provided with the passivation layer through hole and allowing the transparent electrode to be connected with the drain electrode of the TFT via the passivation layer through hole.

5. The method for manufacturing the array substrate according to claim 3, wherein
    the metal layer comprises a gate metal layer; the insulating layer comprises a gate insulating layer; the insulating layer through-hole region comprises a gate insulating layer through-hole region; the insulating layer through hole comprises a gate insulating layer through hole;
    the process of etching the metal layer in the metal layer etch region comprises: etching the gate metal layer in a gate metal layer etch region to form patterns of a gate line, a gate electrode of a switching TFT and a gate electrode of a drive TFT, in which the insulating layer through-hole region is disposed in the gate electrode of the drive TFT;
    before the process of stripping off the photoresist in the insulating layer through-hole region to form the insulating layer through hole, the method further comprises: forming an active layer on the substrate provided with the gate insulating layer; and
    after the process of stripping off the photoresist in the insulating layer through-hole region to form the insulating layer through hole, the method further comprises: depositing a source/drain metal layer on the substrate provided with the gate insulating layer through hole and allowing a drain electrode of the switching TFT to be connected with the gate electrode of the drive TFT via the gate insulating layer through hole.

6. The method for manufacturing the array substrate according to claim 5, after the process of depositing the source/drain metal layer on the substrate provided with the gate insulating layer through hole, further comprising:
    coating photoresist on the substrate provided with the source/drain metal layer;
    performing complete exposure and development on the photoresist in a source/drain metal layer etch region to remove the photoresist in the source/drain metal layer etch region, taking a passivation layer through-hole region as a non-exposed region, and performing half-exposure and development on the photoresist outside of the passivation layer through-hole region, so that the thickness of the photoresist outside of the passivation layer through-hole region is reduced;
    etching the source/drain metal layer in the source/drain metal layer etch region to form patterns of a data line, source/drain electrodes of the switching TFT and source/drain electrodes of the drive TFT, in which the passivation layer through-hole region is at the drain electrode of the drive TFT;
    ashing the photoresist outside of the source/drain metal layer etch region to remove the photoresist outside of the source/drain metal layer etch region and the passivation layer through-hole region, so that the thickness of the photoresist in the passivation layer through-hole region is reduced; and
    depositing a passivation layer on the substrate provided with the photoresist in the passivation layer through-hole region, stripping off the photoresist in the passivation layer through-hole region, and forming a passivation layer through hole.

7. The method for manufacturing the array substrate according to claim 6, after the process of forming the passivation layer through hole, further comprising:
    forming a transparent electrode on the substrate provided with the passivation layer through hole and allowing the transparent electrode to be connected with the drain electrode of the drive TFT via the passivation layer through hole.

8. The method for manufacturing the array substrate according to claim 6, wherein the ashing is $O_2$ plasma ashing.

9. The method for manufacturing the array substrate according to claim 3, wherein the half-exposure is half-tone exposure or gray-tone exposure.

10. The method for manufacturing the array substrate according to claim 3, wherein the ashing is $O_2$ plasma ashing.

* * * * *